United States Patent [19]

Okamoto

[11] Patent Number: 5,008,700
[45] Date of Patent: Apr. 16, 1991

[54] COLOR IMAGE RECORDING APPARATUS USING INTERMEDIATE IMAGE SHEET

[75] Inventor: Tsugio Okamoto, Kani, Japan

[73] Assignee: Brother Kogyo Kabushiki Kaisha, Japan

[21] Appl. No.: 276,016

[22] Filed: Nov. 25, 1988

[30] Foreign Application Priority Data

Nov. 27, 1987 [JP] Japan ............................ 62-181514[U]

[51] Int. Cl.$^5$ ............................................. G03B 27/32
[52] U.S. Cl. ...................................... 355/27; 355/41
[58] Field of Search ....................... 355/27, 28, 29, 30, 355/32, 38, 35, 41; 430/138

[56] References Cited

U.S. PATENT DOCUMENTS

| 4,008,962 | 2/1977 | Nepper | 355/32 |
| 4,797,713 | 1/1989 | Terashita et al. | 355/38 |
| 4,810,614 | 3/1989 | Sangyoji et al. | 430/138 |

Primary Examiner—L. T. Hix
Assistant Examiner—Khanh Dang
Attorney, Agent, or Firm—Oliff & Berridge

[57] ABSTRACT

In a disclosed color image recording apparatus, an elongated, web-like continuous intermediate image sheet is used as a master mask plate for forming a latent image of an original on a photosensitive pressure-sensitive recording sheet. On the master mask plate, there are separately recorded three images of one of the three color components, i.e. blue, green and red. The recording sheet is exposed to light through the respective mask plates to superpose the latent images thereon. The respective color latent images are formed in a predetermined order. The superposed latent images thereon are then developed under pressure to provide a visible image. Since the order of the latent image formation is not interchangeable, a bar code representing the order thereof is printed on the mask plate, whereby upon reading the bar code with an optical reader, the latent images are formed in the predetermined order on the recording sheet even if the mask plate is inserted in reverse order. The bar code may further contain an information regarding exposure condition, so that the exposure condition which varies depending upon the kind of the intermediate image sheet can automatically be controlled in response to the information represented by the bar code.

38 Claims, 4 Drawing Sheets

COLOR IMAGE RECORDING APPARATUS USING INTERMEDIATE IMAGE SHEET

BACKGROUND OF THE INVENTION

The present invention relates to an image recording apparatus which records a color image on a recording medium under a given imaging condition.

Conventionally, there are three types of color copying machines which are of silver chloride photographing type, thermal transfer type and electronic photographing type. The silver chloride photographing type provides a high quality image, but it has shortcomings such that it takes a long time in making a copy and requires a high manufacturing cost as well as a high running cost per one sheet of copy. The thermal transfer type transfers three colors on a copying sheet in superposed manner and therefore has a low color reproducibility. The electronic photographing type is the quickest of all the three in making a copy and provides a high resolution; however, like the first type, it needs a high manufacturing cost as well as a high running cost due to increased cost of maintenance fee.

As a solution to the drawbacks of the above-described color copying machines, a new type of color copying machine has been proposed which provides a high color reproducibility, and is relatively inexpensive as well as easy to maintain. Such a color copying machine uses a photosensitive pressure-sensitive recording medium and sequentially forms latent images of three different colors, red (R), green (G) and blue (B), on the recording medium through light exposure. The recording medium on which the latent images are formed are brought into facial contact with a developer sheet and the latent images are developed under pressure to provide a visible image on the developer sheet. One of the methods for forming the latent images on the photosensitive pressure-sensitive recording medium is performed in the following manner. Individual images of red, green and blue colors are separately recorded as intermediate images on a thermal-sensitive sheet by means of a thermal head or the like. The thermal-sensitive sheet carrying the red image is first superposed on the recording medium, and the latter is exposed to light through or reflected from the thermal-sensitive sheet by means of a light source such as a fluorescent lamp. Then, the thermal-sensitive sheet carrying the red image is replaced by the thermal-sensitive sheet carrying the green image and exposure is similarly taken place to superpose the green latent image on the red latent image. Finally, the thermal-sensitive sheet carrying the green image is replaced by the thermal-sensitive sheet carrying the blue image and exposure similarly takes place to superpose the blue image on the red and green latent images. Thereafter, the recording medium is brought into facial contact with the developer sheet to pressure develop the latent images, whereby a visible full color image is provided on the developer sheet. Since the above-described method requires an intermediate image sheet on which images of three primary colors are separately formed, it is necessary to precisely position the intermediate images of each color component on the proper position of the photosensitive pressure-sensitive recording medium. In making a plurality of color copies, therefore, the same number of intermediate images for each color component should be prepared, thus requiring a large number of thermal-sensitive sheets and taking a long time to this effect. Furthermore, the image recording apparatus is made large in size manufacturing cost is increased.

As a solution to this problem, it has been proposed to separate the apparatus into an intermediate image recording apparatus and exposing/developing unit, in which an intermediate image sheet has been prepared in advance by the intermediate image recording apparatus, and the image sheet is placed on an original support stand of the exposing/developing unit and is exposed to light by the movement of this stand.

According to such an exposing/developing unit, since the order of placing the intermediate image sheets on the original support stand is designated depending upon the color of the intermediate images, if the intermediate image sheets are set in the wrong order, a desired color image will not be obtained.

Particularly, in the case where each of the intermediate images is formed on an individual cut sheet and those need to be placed on the original support stand one by one, attention should particularly be paid to set the cut sheets in the correct order as compared with the case where intermediate images of three colors are sequentially recorded on a continuous sheet.

SUMMARY OF THE INVENTION

Accordingly, it is an object of this invention to provide an image recording apparatus in which at the time of recording an intermediate image on an intermediate image sheet by a separately provided intermediate image recording apparatus, a machine readable data representative of an imaging condition and an exposure condition are recorded thereon in addition to the intermediate image, whereby even if an operator sets the intermediate image sheets in the wrong direction or wrong order, the image recording apparatus reads the machine readable data and automatically sets the image condition and exposure condition. A desired color image can thus be obtained.

To achieve this and other objects, there is provided an image recording apparatus for recording an image of an original on a first sheet, said apparatus using a second sheet and a third sheet, said second sheet carrying thereon at least one monochromatic color image corresponding to a color component of the original image and a machine readable data representative of a recording condition for recording the color image on said third sheet, said apparatus comprising:

means for reading said machine readable data and providing an instruction regarding the recording condition;

means for irradiating light onto said third sheet through said second sheet to record a latent image corresponding to the color image on said second sheet;

means for controlling said irradiating means in response to said instruction; and means for developing the latent image and providing a visible image on said first sheet.

According to the image recording apparatus according to the invention, a recording condition is controlled in response to the instruction irrespective of the direction that the intermediate image sheet is set or the order that the intermediate image sheets are supplied. The second sheet, i.e. an intermediate image sheet, may either be a continuous sheet or a cut sheet. As such, a full color image formation is ensured.

BRIEF DESCRIPTION OF THE DRAWINGS

An embodiment of the invention will now by described with reference to the accompanying drawings, in which.

DETAILED DESCRIPTION OF THE PREFERRED EMBODIMENTS

Figure 1:
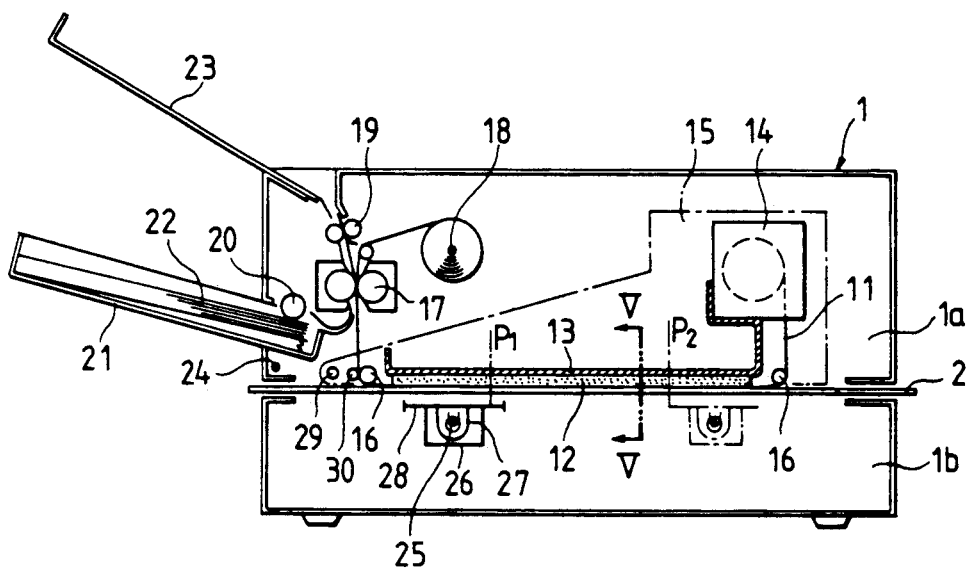
FIG. 1 is a lateral cross-sectional view illustrating an overall structure of an image recording apparatus according to an embodiment of the present invention.
Figure 2:
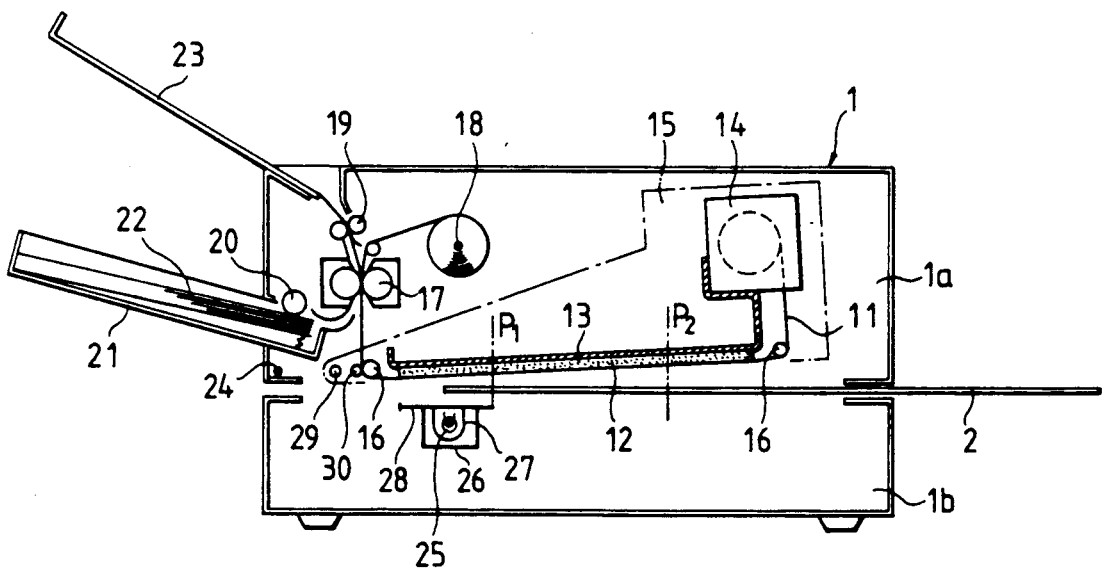
FIG. 2 is a lateral cross-sectional view of an image recording apparatus according to an embodiment of the present invention, illustrating a recording medium cassette holder being in lifted condition.
Figure 3:
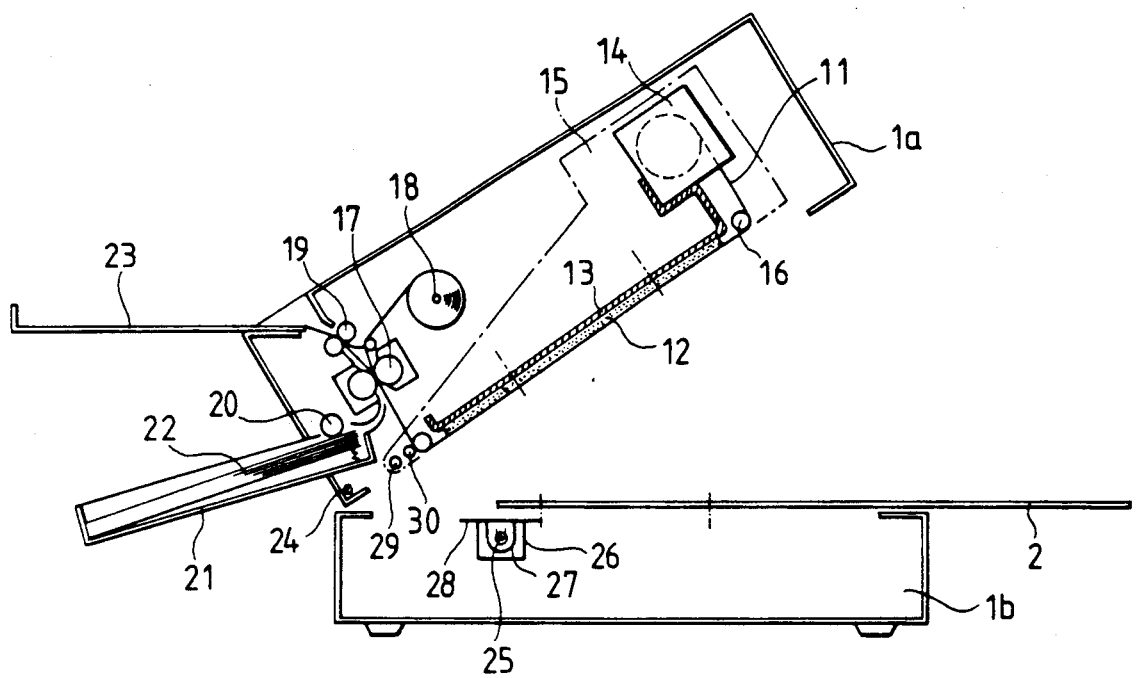
FIG. 3 is a lateral cross-sectional view of an image recording apparatus according to the embodiment of the present invention, illustrating an upper section being in open state.
Figure 4:
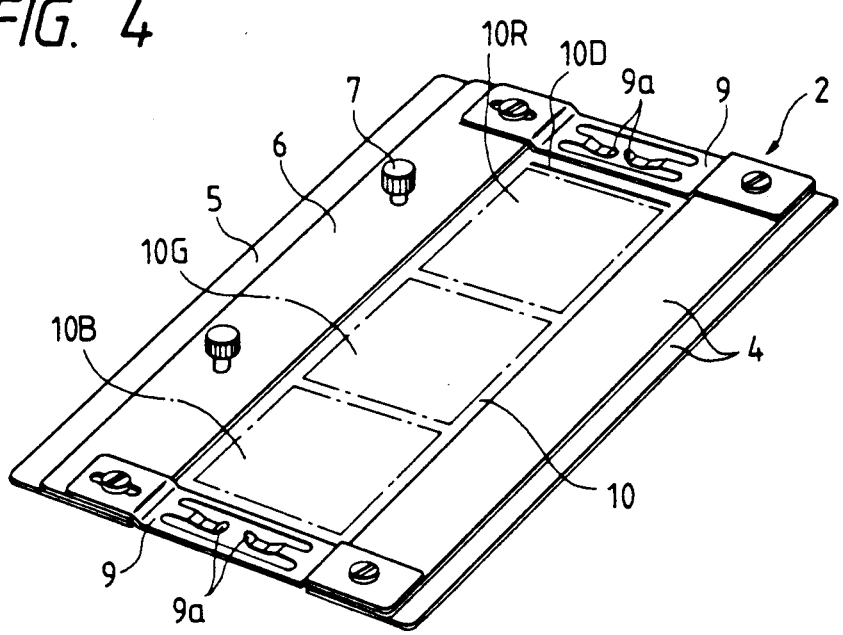
FIG. 4 is a perspective view of an original support stand.
Figure 5:
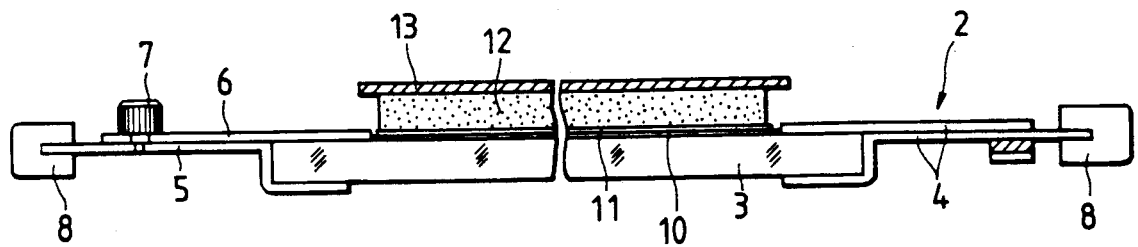
FIG. 5 is a cross-sectional view of FIG. 1 taken along the line V—V.

FIGS. 1 through 5 illustrate a color image recording apparatus according to one embodiment of this invention, in which used is a continuous intermediate image sheet on which intermediate images are recorded. A main body 1 of the image recording apparatus is made up of an upper portion 1a and a lower portion 1b. As shown in FIG. 3, the upper portion 1a is pivotally movable about a fulcrum 24 in counterclockwise direction from the closed state. The lower portion 1b includes an original support stand 2 and a light source unit 26 which is movable along the stand 2. The light source unit 26 includes an exposure light source 25, such as a fluorescent lamp, a reflector 27 for upwardly reflecting light, and a filter 28 which allows to pass only light of wavelengths which selectively photocures cyan (C), magenta (M) and yellow (Y) microcapsules coated on a photosensitive pressure-sensitive recording medium 11. As shown in FIGS. 4 and 5, the original support stand 2 includes an original support stand glass 3 on which an intermediate image sheet 10 is placed, a righthand glass holder 4, a lefthand glass holder 5, a side plate 6 for regulating the position of the intermediate image sheet 10, side plate adjusting screws 7 for adjusting the position of the side plate 6 in widthwise direction so that the intermediately image sheet 20 is fittingly placed between the righthand glass holder 4 and the side plate 6, and original fixing springs 9 for fixedly holding the intermediate image sheet 10. This stand 2 is movably disposed on a pair of guide rails 8 so as to be projectable from the main body 1 and detachable therefrom.

A recording medium cassette holder 15 contains the photosensitive pressure-sensitive recording medium 11, a recording medium cassette 14 for retaining the recording medium 11, an original pressing plate 13, and an original pressing sponge 12 for rendering the recording medium 11 in intimate contact with the intermediate image sheet 10. This cassette holder 15 is rotatable about a fulcrum 29. The image recording apparatus further includes a developer sheet cassette 21 in which developer sheets 22 are stacked, a developer sheet feed roller 20, a pressure developing unit 17 for developing the latent image on the photosensitive pressure-sensitive recording medium under pressure to produce a visible image on the developer sheet 22, a take-up roller 18 for winding the exhausted recording medium 11, developer sheet discharge rollers 19 for discharging the developer sheet 22 out of the main body 1, and a developer sheet tray 23 for receiving the discharged developer sheet 22.

Figure 6A:
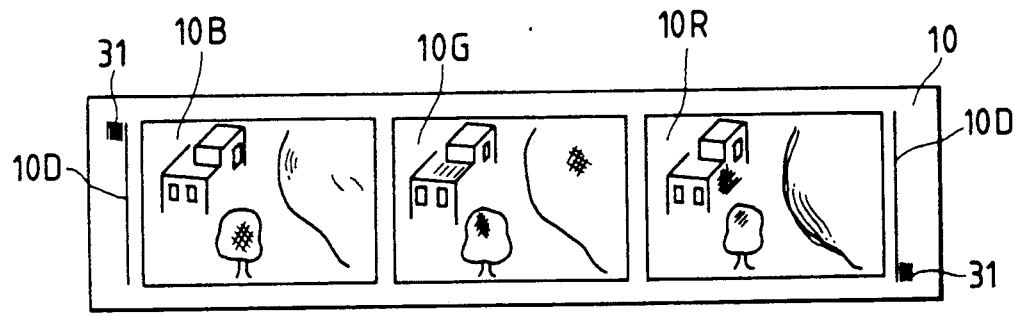
FIGS. 6A through 6C are plan views each illustrating an example of an intermediate image sheet.
Figure 6B:
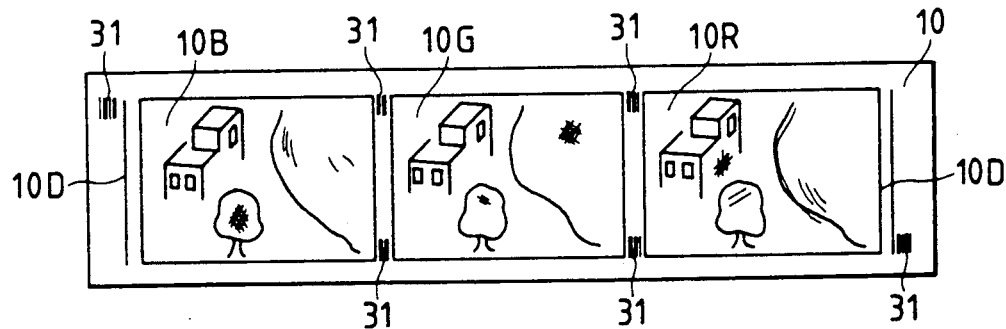
Figure 6C:
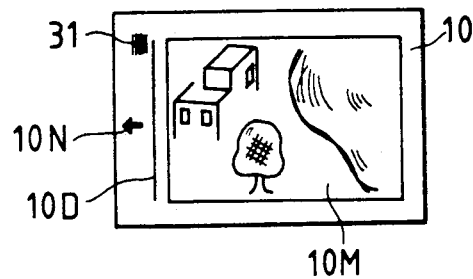

FIGS. 6A through 6C illustrate three examples of the intermediate image sheet 10 on which intermediate images are formed by an intermediate image recording apparatus (not shown). In FIGS. 6A and 6B, three color images, i.e. red image 10R, green image 10G and blue image 10B, alignment lines 10D and bar codes 31 representing an image/exposure condition are recorded on a continuous intermediate image sheet 10. The alignment lines 10D and bar codes 31 are recorded in a monochromatic color.

In FIG. 6C, an image 10M of one of the three primary colors, an alignment line 10D, an arrow 10N indicating a direction of insertion, and a bar code 31 representing an image/exposure condition are similarly recorded on an intermediate image sheet 10 of a cut sheet.

Figure 7:
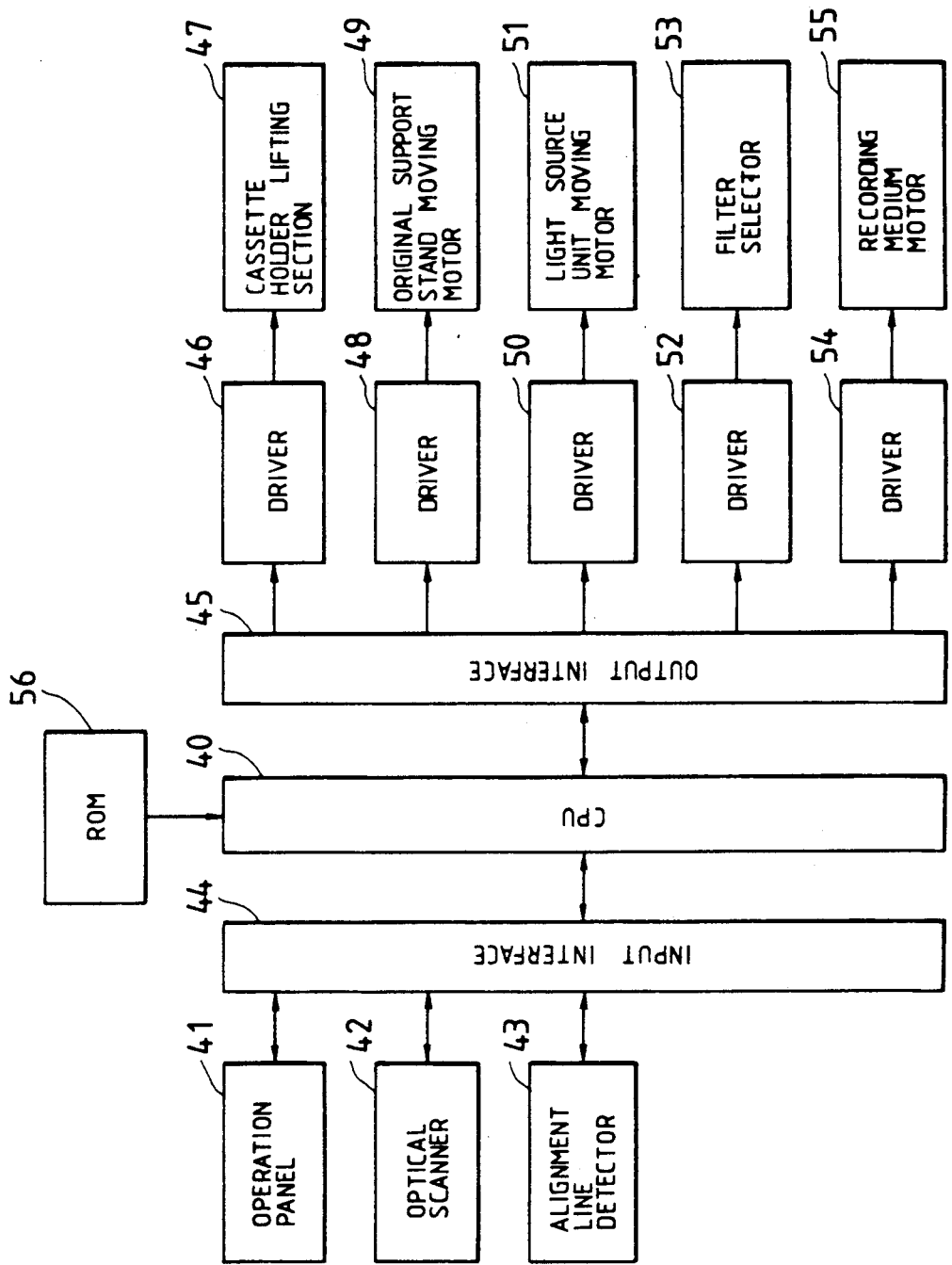
FIG. 7 is a block diagram showing a controller of the image recording apparatus.

Referring now to FIG. 7, description will be made with reference to a controller of the image recording apparatus arranged as described above. A CPU (central processing unit) 40 constitutes control means and is connected to a ROM (read-only memory) 56 in which is stored an operational program for the entire apparatus 1. The CPU 40 is also connected through an input interface 44 to an operation panel 41 having a copy button, a copy number set button, etc., an optical scanner 42, such as a bar code reader, for scanning and reading the bar code 31, and an alignment line detector 43 for detecting the alignment line 10D on the intermediate image sheet 10. The CPU 40 receives various pieces of data and signals from the units connected thereto. The CPU 40 is further connected to a recording medium cassette holder lifting section 47, an original support stand moving motor 49, a light source unit moving motor 51, a filter selector 53 and a photosensitive pressure-sensitive recording medium motor 55 through an output interface 45 and associated drivers 46 through 54. The CPU 40 sends various control signals, such as a drive signal, stop signal and drive speed signal, to these units through the output interface 45, e.g., actuation means.

The operation of the image recording apparatus will be described illustrating means for reading and/or changing recording condition. Description will be made with reference to the case where the intermediate image sheet 10 shown in FIG. 6A is used. On the intermediate image sheet 10, one of the two alignment lines 10D is drawn in a position slightly apart from the rightside edge of the sheet, and the R-color intermediate image 10R, G-color intermediate image 10G and B-color intermediate image 10B are recorded in the stated order at the left side of that alignment line 10D. There are provided predetermined intervals between the rightside alignment line 10D and the image 10R and between adjacent images. Another alignment line 10D is drawn in a position slightly apart from the leftside edge of the sheet. On the lower right and upper left portions of the intermediate image sheet 10 are recorded the bar codes 31 representing an order of the arrangement of the intermediate images (an order of R, G, and B, for example) and an exposure condition, e.g. exposure period of time. Information relating to the exposure condition needs to be provided, since it is necessary to change the exposure period of time or other factors for the exposure to be in agreement with the kinds of the recording mediums (thermal-sensitive sheet, transparent film, etc.). The intermediate image sheet 10 on the original support stand 2 is scanned by the light from the light source 25 at a constant speed. Therefore, once the alignment line 10D is detected, the position of each of the intermediate images is identified.

An operator first lifts the rightside of the upper section 1a and rotate the latter to be in a state shown in FIG. 3, and the intermediate image sheet 10 is placed on the original support stand 2 with its image face up. As best shown in FIG. 4, one longitudinal edge of the sheet 10 is aligned with the side wall of the righthand glass holder 4 and the opposite edge is held by the side wall 15 of the side plate 6 upon adjusting this plate 6 with the screws 7. The operator then fixes both widthwise edge portions of the intermediate image sheet 10 under the original securing springs 9. Then, the operator closes the upper section 1a (see FIG. 2) and depresses a copy start button provided on the operation panel 41. In response thereto, the stand 2 moves rightwardly and stops at the rightmost start position. Then, the stand 2 moves leftwardly. The optical scanner 42 scans and reads the bar code 31 and the data read out therefrom is sent through the input interface 44 to the CPU 40.

In response to the data sent to the CPU 40, the latter sends a set of commands to the drivers 46, 48, 50, 52 and 54 through the output interface 45. Those commands are selected from the operational program stored in the ROM 56 and provide instructions for the exposure order and exposure condition. More specifically, in the case where the intermediate image sheet 10 in FIG. 6A is disposed with its left side on the left side of the original support stand 2 and the intermediate image sheet 10 is a thermal-sensitive sheet, the order of blue, green and red together with the proper exposure time for the thermal-sensitive sheet are the contents of the commands issued from the CPU 40. Next, the alignment line detector 43 detects the leftside alignment line 10D in the status shown in FIG. 2. After the original support stand 2 has moved leftwardly by a given distance from the start position, the photosensitive pressure-sensitive recording medium 11 is fed leftward by a predetermined distance and is wound around the take-up roller 18, whereby unexposed photosensitive pressure-sensitive recording medium 11 is placed above the intermediate image sheet 10. The cassette holder 15 is swung clockwise about the fulcrum 29, so that the recording medium 11 is brought into facial contact with the intermediate image sheet 10.

The photosensitive pressure-sensitive recording medium 11 is made up of a polyester film substrate of about 25 microns in thickness, and on which coated are microcapsules which are made of photosensitive resins selectively having one of three peak sensitivities at wavelengths of 450, 550 and 650 nm and encapsulate one of cyan (C), magenta (M) and yellow (Y) chromogenic materials therein. Based on the exposure condition command from the CPU 40, a blue filter 28B which allows to pass only the light of a wavelength of around 650 nm is positioned above the light source 25, and the intermediate image sheet 10 is exposed to light in the region between $P_1$ and $P_2$ at a scanning speed proper to the thermal-sensitive sheet. At this time, the original support stand 2 is stationary and the light source unit 26 is moving rightwardly at the scanning speed mentioned above. Consequently, of the microcapsules coated on the recording medium 11, only those of the Y microcapsules are photocured.

Subsequently, the cassette holder 15 is moved slightly upwardly and the intermediate image sheet 10 is moved leftwardly by one image pitch. During this period, the light source unit 26 is moved to the leftmost initial position. Then, the cassette holder 15 is then descended to bring the intermediate image sheet 10 into intimate contact with the photosensitive pressure-sensitive recording medium 11. It should be noted that the recording medium 11 remains at the same position and only the intermediate image sheet 10 is fed by one image pitch. Therefore, the intermediate image 10G is superposed on the latent image of the intermediate image 10B. Thereafter, based on the exposure condition command, the filter 28 is switched to the green filter 28G that allows to pass only the light of a wavelength of around 550 nm, and the light source unit 26 scans and exposes to light the intermediate image sheet 10 in the region between P1 and P2. As a result, only those of the magenta microcapsules on the photosensitive pressure-sensitive recording medium 11 are photocured. In the subsequent process, the cassette holder 15 is similarly lifted, the light source unit 26 is moved back to the initial position, and the original support stand 2 is moved leftward by one image pitch. As a result, the intermediate image 10R is superposed on the recording medium 11 having the blue and green latent images formed thereon. Thereafter, the filter 28 is switched to the red filter 28R that allows to pass only the light of a wavelength of around 450 nm, and the light source unit 26 scans and exposes to light the intermediate image sheet 10 in the same region.

After the latent images of B, G and R color images are formed on the recording medium 11 in the superposed manner, the cassette holder 15 is lifted, the light source unit 26 is moved back to the initial position, and the recording medium 11 is transported leftwardly and then upwardly via the guide roller 16.

The developer sheet 22 is fed out from the developer sheet cassette 21 by the feed roller 20 in timed relation to the transportation of the recording medium 11. The developer sheet 22 and the recording medium 11 are brought into facial contact with each other and enters into the developing unit 17 where the superposed latent images are developed by the aid of a developer material coated on the surface of the developer sheet 22 and a visible color image is produced on the developer sheet 22. The recording medium 11 is then wound around the take-up roller 18 and the developer sheet 22 is discharged onto the developer sheet tray 23 by the discharge rollers 19. In order to make a plurality of copies, the above operation may be repeated by the necessary number of times with respect to only a single intermediate image sheet 10.

If the intermediate image sheet 10 is set with its right side on the left side of the original support stand 2, the scanner 42 scans the lower right bar code 31 in FIG. 6A and the exposure order of the intermediate images 10R, 10G and 10B is instructed based on the information contained in the bar code 31. The same color copy is obtained by implementing the above-described operations substantially in the same manner.

In the intermediate image sheet shown in FIG. 6B, there are provided six bar codes in the positions as shown. The firstly scanned bar code (either the one in the rightside lower portion or the one in the leftside upper portion) contains information of both the exposure order of the respective color images and the exposure condition of the red color image. The remaining bar codes provided in association with the respective color images contain information of only the exposure condition of the associated color image.

The intermediate image sheet 10 shown in FIG. 6C is of a cut-sheet type, on which one of the three intermediate images is recorded. A bar code 31 is provided to each of the intermediate image sheets 10, in which contained is information relating to the exposure order and exposure condition in association with the color image thereon. When using such a cut-sheet type intermediate image sheet 10, the insertion or setting direction of the sheet 10 should be determined in advance. To prevent an error in the direction of insertion or setting of this sheet, an arrow mark 10N is printed on the sheet. Although the operator needs to set the intermediate image sheet 10 in the direction indicated by the arrow, the order of setting these sheets is not mandatory, so that an error in making a color copy does not tend to occur when manually setting the sheets. With the use of cut-sheet type intermediate image sheets 10, it is necessary to move the original support stand 2 in a different fashion from the one described above, but the setting of the exposure condition and the exposure and development processes can be executed in the same manner as described.

According to the apparatus according to the present invention, it is also posssible to make a copy of a color original or photograph having a white back surface by setting such an original in intimate contact with the photosensitive pressure-sensitive recording medium 11 on the original support stand 2 and scanning it.

It would be apparent to those skilled in the art that this invention is in no way restricted to the above particular embodiment, but can be modified in various manners within the scope and spirit of the invention. For instance, the present image recording apparatus may be designed in such a way that the original support stand 2 is projectable outwardly of the body of the apparatus and in this state the intermediate image sheet 10 can be set thereon. Further, the exposure may be performed with a fixedly provided light source rather than moving the light source. Since the photosensitive pressure-sensitive recording medium 11 might be exposed to light to a certain extent at the time when the upper section 1a is lifted (though not particularly mentioned in the foregoing description), it is necessary to provide a winding device for automatically winding the photosensitive pressure-sensitive recording medium 11 immediately after the upper section 1a is closed. Further, although description has been made with respect to a bar code, the present invention is not restricted thereto. Any type of machine readable data may be available.

As should be understood from the above, according to this invention, an encoded data or a machine readable data representing the image/exposure conditions is recorded on an intermediate image sheet and is read by an optical reader, so that the image/exposure conditions are automatically set on the basis of the information contained in the data. Therefore, the operator needs not worry about the direction of setting of the intermediate image sheet or the order of setting a plurality of cut sheets.

What is claimed is:

1. An image recording apparatus for recording an image of an original on a first sheet, said apparatus using a second sheet and a third sheet, said second sheet carrying thereon at least one monochromatic color image corresponding to a color component of the original image and a machine readable data including arrangement information and exposure information representative of a recording condition for recording the color image on said third sheet, said apparatus comprising:
   means for reading said machine readable data and providing an instruction regarding the recording condition;
   means for irradiating light onto said third sheet through said second sheet to record a latent image on said third sheet corresponding to the color image on said second sheet;
   means for controlling said irradiating means in response to said instruction; and
   means for developing the latent image and providing a visible image on said first sheet.

2. An image recording apparatus according to claim 1, wherein said first sheet is a developer sheet having a surface coated with a developer material, and said third sheet is a photosensitive pressure-sensitive recording sheet having a surface coated with microcapsules, each of said microcapsules encapsulating therein a photosensitive resin and a chromogenic material, said chromogenic material containing one of cyan, magenta and yellow chromogenic materials, a mechanical strength of said microcapsules being variable when said microcapsules are irradiated by light.

3. An image recording apparatus according to claim 2, wherein said developing means applies pressure to said photosensitive pressure-sensitive recording sheet to rupture weaker microcapsules, thereby allowing the chromogenic material to release from the microcapsules, and wherein development of the latent image is taken place by the reaction of said chromogenic material on said third sheet with the developer material on said first sheet.

4. An image recording apparatus according to claim 3, wherein red, green and blue color images corresponding to the color components of the original image are separately recorded on said second sheet, and wherein said latent images corresponding to the three color components of said original image are superposed on said photosensitive pressure-sensitive recording sheet.

5. An image recording apparatus according to claim 4, wherein said machine readable data on said second sheet represents an order for recordation of said three color images on said photosensitive pressure-sensitive recording sheet.

6. An image recording apparatus according to claim 5, wherein said machine readable data on said second sheet further represents a period of time that said irradiation of light is taken place.

7. An image recording apparatus according to claim 6, wherein said machine readable data is a bar code.

8. An image recording apparatus according to claim 1, wherein said reading means comprises an optical reader.

9. An image recording apparatus according to claim 1, wherein said second sheet is a continuous sheet.

10. An image recording apparatus according to claim 1, wherein said second sheet is a cut sheet.

11. An image recording apparatus according to claim 6, wherein said controlling means comprises a central processing unit; an input interface connected to said central processing unit, said central processing unit receiving said instruction from said reading means; a read-only memory for storing a predetermined number of recording conditions, said central processing unit reading one of said recording conditions from said read-only memory in response to said instruction; an output interface connected to said central processing unit; a driver unit connected to said output interface; and a motor connected to both said driver unit and said irradiating means, said motor being rotated in response to the recording condition read out of said read-only memory and said irradiating means being moved in accordance with the rotation of said motor, whereby said photosensitive pressure-sensitive recording sheet is irradiated for a period of time dependent upon the movement of said irradiating means.

12. An image recording apparatus according to claim 11, further comprising means for supporting said second sheet; means for bringing said second sheet and said photosensitive pressure-sensitive recording sheet into facial contact with each other; and means for moving said supporting means.

13. An image recording apparatus according to claim 12, wherein said moving means is a second motor, said motor being rotated in response to the recording condition read out of said read-only memory.

14. An image recording apparatus according to claim 13, wherein said second sheet further carries a reference line mark, and said apparatus further comprises a detector for detecting said reference line mark and providing a detection signal, wherein said supporting means is moved by a predetermined distance by said moving means in response to said detection signal.

15. An image recording apparatus for recording an image of an original on a first sheet, said first sheet being a developer sheet having a surface coated with a developer material, said apparatus using a second sheet and a third sheet, said second sheet carrying thereon at least one monochormatic color image corresponding to a color component of the original image and a machine readable data representative of a recording condition for recording the color image on said third sheet, said third sheet being a photosensitive pressure-sensitive recording sheet having a surface coated with microcapsules, each of said microcapsules encapsulating therein a photosensitive resin and a chromogenic material, said chromogenic material containing one of cyan, magenta and yellow chromogenic material, a mechanical strength of said microcapsules being variable when said microcapsules are irradiated by light, said apparatus comprising:

means for reading said machine readable data and providing an instruction regarding the recording condition;

means for changing a recording condition of the color image recorded on said third sheet, said recording condition changing means including a light source, said light source irradiating light onto said third sheet through said second sheet to record a latent image on said third sheet corresponding to the color image on said second sheet;

means for controlling said recording condition changing means in response to said instruction, said controlling means comprising a central processing unit, an input interface connected to said central processing unit, said central processing unit receiving said instruction from said reading means, a read-only memory for storing a predetermined number of recording conditions, said central processing unit reading one of said recording conditions from said read-only memory in response to said instruction, and output interface connected to said central processing unit, a driver unit connected to said output interface, and actuation means connected to both said driver unit and said recording condition changing means, said actuation means being actuated in response to the recording condition read out of said read-only memory; and means for developing the latent image and providing a visible image on said first sheet.

16. An image recording apparatus according to claim 15, wherein said developing means applies pressure to said photosensitive pressure-sensitive recording sheet to rupture weaker microcapsules, thereby allowing the chromogenic material to release from the microcapsules, and wherein development of the latent image is taken place by the reaction of said chromogenic material on said third sheet with the developer material on said first sheet.

17. An image recording apparatus according to claim 16, wherein red, green and blue color images corresponding to the color components of the original image are separately recorded on said second sheet, and wherein said latent images corresponding to the three color components of said original image are superposed on said photosensitive pressure-sensitive recording sheet.

18. An image recording apparatus according to claim 17, wherein said machine readable data on said second sheet represents an order for recordation of said three color images on said photosensitive pressure-sensitive recording sheet.

19. An image recording apparatus according to claim 18, wherein said machine readable data on said second sheet further represents a period of time that said irradiation of light is taken place.

20. An image recording apparatus according to claim 19, wherein said machine readable data is a bar code.

21. An image recording apparatus according to claim 15, wherein said reading means comprises an optical reader.

22. An image recording apparatus according to claim 15, wherein said second sheet is a continuous sheet.

23. An image recording apparatus according to claim 15, wherein said second sheet is a cut sheet.

24. An image recording apparatus according to claim 15, further comprising means for supporting said second sheet; means for bringing said second sheet and said photosensitive pressure-sensitive recording sheet into facial contact with each other; and means for moving said supporting means.

25. An image recording apparatus according to claim 24, wherein said moving means is a motor, said motor being rotated in response to the recording condition read out of said read-only memory.

26. An image recording apparatus according to claim 25, wherein said second sheet further carries a reference line mark, and said apparatus further comprises a detector for detecting said reference line mark and providing a detection signal, wherein said supporting means is moved by a predetermined distance by said moving means in response to said detection signal.

27. An image recording apparatus for recording an image of an original on a first sheet, said apparatus using a second sheet and a third sheet, said second sheet carrying thereon at least one monochromatic color image corresponding to a color component of the original image and a machine readable data representative of a recording condition for recording the color image on said third sheet, said apparatus comprising:

means for reading said machine readable data and providing an instruction regarding the recording condition;

means for irradiating light onto said third sheet through said second sheet to record a latent image on said third sheet corresponding to the color image on said second sheet;

means for controlling said irradiating means in response to said instruction;

means for developing the latent image and providing a visible image on said first sheet;

wherein said first sheet is a developer sheet having a surface coated with a developer material, and said third sheet is a photosensitive pressure-sensitive recording sheet having a surface coated with microcapsules, each of said microcapsules encapsulating therein a photosensitive resin and a chromogenic material, said chromogenic material containing one of cyan, magenta and yellow chromogenic materials, a mechanical strength of said microcapsules being variable when said microcapsules are irradiated by light; and wherein said controlling means comprises a central processing unit; an input interface connected to said central processing unit, said central processing unit receiving said instruction from said reading means; a read-only memory for storing a predetermined number of recording conditions, said central processing unit reading one of said recording conditions from said read-only memory in response to said instruction; an output interface connected to said central processing unit; a driver unit connected to said output interface; and a motor connected to both said driver unit and said irradiating means, said motor being rotated in response to the recording condition read out of said read-only memory and said irradiating means being moved in accordance with the rotation of said motor, whereby said photosensitive pressure-sensitive recording sheet is irradiated for a period of time dependent upon the movement of said irradiating means.

28. An image recording apparatus according to claim 27, wherein said developing means applies pressure to said photosensitive pressure-sensitive recording sheet to rupture weaker microcapsules, thereby allowing the chromogenic material to release from the microcapsules, and wherein development of the latent image is taken place by the reaction of said chromogenic material on said third sheet with the developer material on said first sheet.

29. An image recording apparatus according to claim 28, wherein red, green and blue color images corresponding to the color components of the original image are separately recorded on said second sheet, and wherein said latent images corresponding to the three color components of said original image are superposed on said photosensitive pressure-sensitive recording sheet.

30. An image recording apparatus according to claim 29, wherein said machine readable data on said second sheet represents an order for recordation of said three color images on said photosensitive pressure-sensitive recording sheet.

31. An image recording apparatus according to claim 30, wherein said machine readable data on said second sheet further represents a period of time that said irradiation of light is taken place.

32. An image recording apparatus according to claim 31, wherein said machine readable data is a bar code.

33. An image recording apparatus according to claim 27, wherein said reading means comprises an optical reader.

34. An image recording apparatus according to claim 27, wherein said second sheet is a continuous sheet.

35. An image recording apparatus according to claim 27, wherein said second sheet is a cut sheet.

36. An image recording apparatus according to claim 35, further comprising means for supporting said second sheet; means for bringing said second sheet and said photosensitive pressure-sensitive recording sheet into facial contact with each other; and means for moving said supporting means.

37. An image recording apparatus according to claim 36, wherein said moving means is a second motor, said motor being rotated in response to the recording condition read out of said read-only memory.

38. An image recording apparatus according to claim 37, wherein said second sheet further carries a reference line mark, and said apparatus further comprises a detector for detecting said reference line mark and providing a detection signal, wherein said supporting means is moved by a predetermined distance by said moving means in response to said detection signal.

* * * * *